United States Patent
Henderson (12) 
(10) Patent No.: US 6,861,181 B1
(45) Date of Patent: Mar. 1, 2005

(54) PHOTOMASK AND METHOD FOR EVALUATING AN INITIAL CALIBRATION FOR A SCANNING ELECTRON MICROSCOPE

(75) Inventor: Robert K. Henderson, Austin, TX (US)

(73) Assignee: DuPont Photomasks, Inc., Round Rock, TX (US)

( * ) Notice: Subject to any disclaimer, the term of this patent is extended or adjusted under 35 U.S.C. 154(b) by 231 days.

(21) Appl. No.: 10/247,426

(22) Filed: Sep. 19, 2002

Related U.S. Application Data (60) Provisional application No. 60/323,402, filed on Sep. 19, 2001.

(51) Int. Cl.[7] .................................................. G03F 9/00
(52) U.S. Cl. .............................. 430/5; 430/30; 430/296; 430/942; 382/144
(58) Field of Search .............................. 430/5, 30, 296, 430/942; 382/144

(56) References Cited

U.S. PATENT DOCUMENTS 6,573,497 B1 * 6/2003 Rangarajan et al. ........ 250/306
6,635,874 B1 * 10/2003 Singh et al. ................ 250/311

OTHER PUBLICATIONS

Presentation at SPIE Lithography Conference Entitled "Photomask Critical Dimension Metrology", St. Johns, Virgin Islands, 28 Pages, Dec. 8, 2000.

* cited by examiner

*Primary Examiner*—Christopher G. Young
(74) *Attorney, Agent, or Firm*—Baker Botts L.L.P.

(57) ABSTRACT

A photomask and method for evaluating an initial calibration for a scanning electron microscope are disclosed. The method includes generating an initial calibration for a SEM that contains a target width for a feature on a reference target and measuring the feature on the reference target in the SEM to determine a measured width for the feature. The measured width is compared to the target width to generate a shift deviation and a current calibration for the SEM is adjusted based on the shift deviation.

30 Claims, 4 Drawing Sheets

PHOTOMASK AND METHOD FOR EVALUATING AN INITIAL CALIBRATION FOR A SCANNING ELECTRON MICROSCOPE

CROSS REFERENCE TO RELATED APPLICATION

This application claims priority from U.S. Provisional Patent Application Ser. No. 60/323,402, filed Sep. 19, 2001, and entitled "Method for Measuring a Critical Dimension of a Photomask By Adjusting the Calibration of an Optical Measurement Tool."

TECHNICAL FIELD OF THE INVENTION

This invention relates in general to the field of photolithography and, more particularly, to a method for evaluating an initial calibration for a scanning electron microscope.

BACKGROUND OF THE INVENTION

As the need for faster and more powerful integrated circuits (ICs) grows, feature sizes on semiconductor wafers for the ICs continue to decrease. Successful production of the ICs may require that features on a photomask used in a lithography system to manufacture the ICs have desired and uniform sizes. Photomask manufacturers routinely evaluate feature sizing performance on photomasks by measuring specific features in order to ensure that the photomasks include features that have the desired and uniform sizes. The features that are evaluated may be generally referred to as critical dimensions (CDs) and may be obtained through the use of metrology tools, such as optical systems or scanning electron microscopes.

Today, most measurements are obtained by using optical systems. These optical systems are typically calibrated by creating an initial magnification factor, also known as a pitch factor, that may be modified through another calibration filter that more accurately aligns the initial magnification factor with a recognized feature width reference. However, as feature sizes have decreased below resolution limits of currently available optical CD measurement tools, the use of scanning electron microscope (SEMs) has increased.

Typically, SEMs are calibrated through an appropriate magnification factor that may be determined through measurement of feature pitch on a reference target, such as a photomask or a semiconductor wafer. The reference target may contain features that have known sizes and represent the CDs for a specific manufacturing process. However, an initial calibration for a SEM based on pitch may not be adequate since CD measurements depend on the accuracy of how the SEM measures the widths of features on a photomask or semiconductor wafer.

The measurements provided by a SEM, however, may be inaccurate for tool calibration. When a surface of a reference target is imaged using a scanning electron beam in a SEM tool, any transient hydrocarbons in the chamber are attracted to the interface of the surface and the beam. As a result, a thin layer of carbon material is deposited on the imaged area of the surface. The carbon deposited during one measurement may be negligible but if a location is measured numerous times (e.g., a location on a reference target used to evaluate the initial calibration of the SEM), a thicker layer of carbon may build up on the surface of the target. The carbon layer may change the size of the feature, and, therefore, the surface characteristics at the measured location. Unless the change in feature size over time is taken into consideration, any measurement of the feature size will be different than the size determined during the initial calibration process and will affect the accuracy when the SEM is re-calibrated.

Furthermore, re-calibration of optical systems and SEMs may be time consuming. Typically, the re-calibration process may involve evaluating the measurement of each relevant feature on the reference target. For example, a reference target may include between eight to twelve reference features over a desired calibration range. The re-calibration process may take numerous hours of the tool's time if each of the features is measured and, therefore, decrease the number of production photomasks or wafers that may be measured during a given time period.

SUMMARY OF THE INVENTION

In accordance with the teachings of the present invention, disadvantages and problems associated with evaluating an initial calibration for a scanning electron microscope (SEM) have been substantially reduced or eliminated. In a particular embodiment, a method for evaluating an initial calibration for a SEM includes adjusting the initial calibration based on a shift deviation created by comparing a measured width of a feature with a target width of the feature.

In accordance with one embodiment of the present invention, a method for evaluating an initial calibration for a SEM includes generating an initial calibration for a SEM that contains a target width for a feature on a reference target. The SEM is used to measure the feature on the reference target to determine a measured width for the feature. The measured width is compared with the target width to generate a shift deviation and a current calibration for the SEM is adjusted based on the shift deviation.

In accordance with another embodiment of the present invention, a system for measuring feature widths on a target includes a computer readable memory and processing instructions encoded in the computer readable memory. The processing instructions, when executed by the processing resource, generate an initial calibration for a SEM that contains a target width for a feature on a reference target. The instructions further measure the feature on the reference target in the SEM to determine a measured width for the feature and compare the measured width with the target width to generate a shift deviation. The processing instructions adjust a current calibration for the SEM based on the shift deviation.

In accordance with a further embodiment of the present invention, a photomask includes a patterned layer formed on at least a portion of a substrate. Features on the patterned layer is measured with a SEM and an initial calibration associated with the SEM is evaluated by generating an initial calibration for the SEM that contains a target width for a feature on a reference target. The feature on the reference target is measured in the SEM to determine a measured width for the feature. The measured width is compared to the target width to generate a shift deviation and a current calibration for the SEM is adjusted based on the shift deviation.

Important technical advantages of certain embodiments of the present invention include the ability to calibrate a SEM by using both pitch and width measurements. Conventional methods for comparing a current calibration of a SEM to an initial calibration are limited to pitch measurements since the SEM may deposit a layer of carbon on the surface of a reference target that is imaged multiple times. The present invention evaluates feature width and pitch by estimating a rate of carbon deposition on the surface of the reference target and evaluates the rate of deposition to determine if it has varied over time. During a re-calibration process for the SEM, the initial size of the feature is adjusted by the estimated rate of carbon deposition and then compared to the measured size to provide an accurate evaluation of the performance of the SEM.

Another important technical advantage of certain embodiments of the present invention includes the ability to adjust an initial calibration for a SEM by measuring no more than three features on a reference target. Since most SEMs may be re-calibrated on a regular basis, a routine sampling of certain features on the reference target may be appropriate. Choosing at least three features on the reference target (e.g., features with sizes at the endpoints and the center of a calibration range) allows for detection of shifts up or down from the initial calibration, detection of slope changes and detection of any arching or bowing departures from the initial calibration. The time required to run the re-calibration process on the SEM may be significantly reduced since each re-calibration process only requires the measurement of three features.

All, some, or none of these technical advantages may be present in various embodiments of the present invention. Other technical advantages will be readily apparent to one skilled in the art from the following figures, descriptions, and claims.

BRIEF DESCRIPTION OF THE DRAWINGS

A more complete understanding of the present invention and advantages thereof may be acquired by referring to the following description taken in conjunction with the accompanying drawings, in which like reference numbers indicate like features, and wherein.

DETAILED DESCRIPTION OF THE INVENTION

Preferred embodiments of the present invention and their advantages are best understood by references to FIGS. 1 through 9, where like numbers are used to indicate like and corresponding parts.

Figure 1:
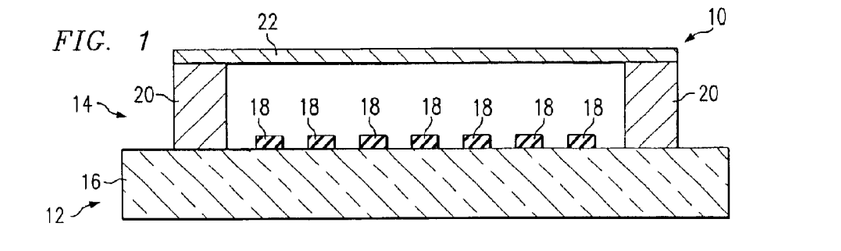
FIG. 1 illustrates a cross-sectional view of a photomask assembly manufactured in accordance with teachings of the present invention.

FIG. 1 illustrates a cross-sectional view of photomask assembly 10 measured in a scanning electron microscope (SEM) that is calibrated by measuring feature widths on a reference target. Photomask assembly 10 includes photomask 12 coupled to pellicle assembly 14. Substrate 16 and patterned layer 18 form photomask 12, otherwise known as a mask or reticle, that may have a variety of sizes and shapes, including but not limited to round, rectangular, or square. Photomask 12 may also be any variety of photomask types, including, but not limited to, a one-time master, a five-inch reticle, a six-inch reticle, a nine-inch reticle or any other appropriately sized reticle that may be used to project an image of a circuit pattern onto a semiconductor wafer. Photomask 12 may further be a binary mask, a phase shift mask (PSM), an optical proximity correction (OPC) mask or any other type of mask suitable for use in a lithography system.

Photomask 12 includes patterned layer 18 formed on substrate 16 that, when exposed to electromagnetic energy in a lithography system, projects a pattern onto a surface of a semiconductor wafer (not expressly shown). Substrate 16 may be a transparent material such as quartz, synthetic quartz, fused silica, magnesium fluoride ($MgF_2$), calcium fluoride ($CaF_2$), or any other suitable material that transmits at least seventy-five percent (75%) of incident light having a wavelength between approximately 10 nanometers (nm) and approximately 450 nm. In an alternative embodiment, substrate 16 may be a reflective material such as silicon or any other suitable material that reflects greater than approximately fifty percent (50%) of incident light having a wavelength between approximately 10 nm and 450 nm.

Patterned layer 18 may be a metal material such as chrome, chromium nitride, a metallic oxy-carbo-nitride (M-O-C-N), where the metal is selected from the group consisting of chromium, cobalt, iron, zinc, molybdenum, niobium, tantalum, titanium, tungsten, aluminum, magnesium and silicon, and any other suitable material that absorbs electromagnetic energy with wavelengths in the ultraviolet (UV) range, deep ultraviolet (DUV) range, vacuum ultraviolet (VUV) range and extreme ultraviolet range (EUV). In an alternative embodiment, patterned layer 18 may be a partially transmissive material, such as molybdenum silicide (MoSi), which has a transmissivity of approximately one percent (1%) to approximately thirty percent (30%) in the UV, DUV, VUV and EUV ranges.

Frame 20 and pellicle film 22 may form pellicle assembly 14. Frame 20 is typically formed of anodized aluminum, although it could alternatively be formed of stainless steel, plastic or other suitable materials that do not degrade or outgas when exposed to electromagnetic energy within a lithography system. Pellicle film 22 may be a thin film membrane formed of a material such as nitrocellulose, cellulose acetate, an amorphous fluoropolymer, such as TEFLON® AF manufactured by E. I. du Pont de Nemours and Company or CYTOP® manufactured by Asahi Glass, or another suitable film that is transparent to wavelengths in the UV, DUV, EUV and/or VUV ranges. Pellicle film 22 may be prepared by a conventional technique such as spin casting.

Pellicle film 22 protects photomask 12 from dust particles by ensuring that the dust particles remain a defined distance away from photomask 12. This may be especially important in a lithography system. During a lithography process, photomask assembly 10 is exposed to electromagnetic energy produced by a radiant energy source within the photolithography system. The electromagnetic energy may include light of various wavelengths, such as wavelengths approximately between the I-line and G-line of a Mercury arc lamp, or DUV, VUV or EUV light. In operation, pellicle film 22 is designed to allow a large percentage of the electromagnetic energy to pass through it. Dust particles collected on pellicle film 22 will likely be out of focus at the surface of the wafer being processed and, therefore, the exposed image on the wafer should be clear. Pellicle film 22 formed in accordance with the teachings of the present invention may be satisfactorily used with all types of electromagnetic energy and is not limited to lightwaves as described in this application.

Photomask 12 may be formed from a photomask blank using a standard lithography process. In a lithography process, a mask pattern file that includes data for patterned layer 18 may be generated from a mask layout file. The mask layout file may include polygons that represent transistors and electrical connections for an integrated circuit. The polygons in the mask layout file may further represent different layers of the integrated circuit when it is fabricated on a semiconductor wafer. For example, a transistor may be formed on a semiconductor wafer with a diffusion layer and a polysilicon layer. The mask layout file, therefore, may include one or more polygons drawn on the diffusion layer and one or more polygons drawn on the polysilicon layer. The polygons for each layer may be converted into a mask pattern file that represents one layer of the integrated circuit. Each mask pattern file may be used to generate a photomask for the specific layer.

The desired pattern may be imaged into a resist layer of the photomask blank using a laser, electron beam or X-ray lithography system. In one embodiment, a laser lithography system uses an Argon-Ion laser that emits light having a wavelength of approximately 364 nanometers (nm). In alternative embodiments, the laser lithography system uses lasers emitting light at wavelengths from approximately 150 nm to approximately 300 nm. Photomask 12 may be fabricated by developing and etching exposed areas of the resist layer to create a pattern, etching the portions of patterned layer 18 not covered by resist, and removing the undeveloped resist to create patterned layer 18 over substrate 16.

Before pellicle assembly 14 is mounted on photomask 12 and photomask-assembly 10 is used in a lithography system, specific features, also known as critical dimensions (CDs), included on patterned layer 18 of photomask 12 may be measured to ensure that the features have the correct dimensions. The CDs may be measured with a metrology system, such as an optical tool, scanning electron microscope (SEM) or any other system that may measure dimensions of less than approximately 100 nm. In order to ensure that the measurements provided by the metrology system are accurate, an initial calibration of the metrology system may be evaluated by repeatedly measuring a select set of features on a reference target that was used to create the initial calibration. In one embodiment, the reference target may be a photomask, semiconductor wafer or any other structure that contains a set of features with known sizes. The initial calibration may be created by measuring widths of the features (e.g., lines, polygons, contacts and spaces between the features) and pitch associated with two or more features.

In one embodiment, a SEM may be used to measure the CDs on a reference target. During the measurement process, hydrocarbons in the SEM may be attracted to the interface between the surface of the reference target and an electron beam generated by the SEM. As a result, a thin layer of carbon may be deposited on the reference target. As the reference target is measured multiple times to validate the initial calibration, the carbon deposited on the surface may change the size of the features on the reference target. The target widths for the features included in the initial calibration for the SEM, therefore, may be adjusted based on an estimated carbon deposition rate and then compared to the measured widths during a re-calibration process to determine the accuracy of the measurements generated by the SEM. In another embodiment, each time the initial calibration is evaluated, the status of the SEM and the accuracy of pitch measurement may also be evaluated to determine if there has been any change.

Once a metrology system has been re-calibrated and any adjustments to compensate for deviations from the initial calibration have been made, the metrology system may be used to measure the CDs on photomask 12. Photomask 12 may then be placed in a lithography system to project an image of a circuit pattern onto a semiconductor wafer. A separate photomask is used for each individual layer of the integrated circuit. For example, one photomask may be used to create the diffusion regions on a wafer and another photomask may be used to create a layer of polysilicon over the diffusion regions.

Figure 2:
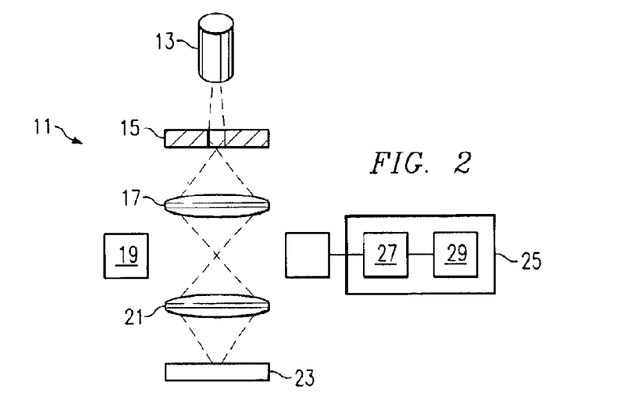
FIG. 2 illustrates a schematic diagram of a scanning electron microscope that may be calibrated with a reference target in accordance with teachings of the present invention.

FIG. 2 illustrates a schematic diagram of SEM that may use a reference target to evaluate an initial calibration for the SEM. In the illustrated embodiment, SEM 11 includes electron gun 13, anode 15, first condenser lens 17, scanning generator 19, final condenser lens 21 and computer system 25. In operation, electron gun 13 produces a stream of monochromatic electrons by applying a positive current to anode 15. Since the electrons are negatively charged, the electrons are attracted to the positive anode and accelerated through an opening in anode 15. First condenser lens 17, which provides coarse detail control, forms an electron beam from the electrons passing through anode 15 and focuses the beam. Scanning generator 19 "scans" or "sweeps" the beam in a desired pattern over the surface of target 23. Final condenser lens 21 focuses the beam to a part of the target 23 that should be imaged. When the beam strikes the surface of target 23, interactions occur inside target 23 and are detected by various instruments in SEM 11. Target 23 may be any type of photomask, semiconductor wafer or artifact, such as a reference target, used to calibrate SEM 11.

Computer system 25 may include processing resource 27 and memory 29. Processing resource 27 may be a microprocessor, a microcontroller, a digital signal processor (DSP) or any other digital or analog circuitry configured to execute processing instructions stored in memory 29. Memory 29 may be random access memory (RAM), electrically erasable programmable read-only memory (EEPROM), a PCMCIA card, flash memory, or any suitable selection and/or array of volatile or non-volatile memory that retains data after the power to computer system 25 is turned off.

In operation, processing instructions are stored in memory 29. Processing resource 27 accesses memory 29 to retrieve the processing instructions and perform various functions included in the processing instructions. In one embodiment, the processing instructions may include a calibration tool that evaluates one or more parameters associated with SEM 11 to determine if an initial calibration for SEM 11 is accurate. When a reference target is placed in SEM 11, the calibration tool may separately evaluate one or more selected parameters associated with SEM 11. The parameters to be evaluated may include, but are not limited to, status of SEM 11, accuracy of a pitch measurement provided by SEM 11, carbon deposition rate on the surface of target 23, and accuracy of a feature width measurement provided by SEM 11. The calibration tool may evaluate one parameter or multiple parameters. During a calibration process, the calibration tool may measure a select set of features on target 23 and apply a control scheme to the measurements in order to determine if the measured features have different values than the measurements in an initial calibration for SEM 11. If the control scheme determines that there is a difference, the calibration tool may determine the nature and magnitude of the deviation and apply an appropriate correction factor so that a current calibration for SEM 11 is approximately equal to the initial calibration.

In some embodiments, the processing instructions for measuring feature widths on a reference target during a calibration process for a SEM may be encoded in computer-usable media. Such computer-usable media may include, without limitation, storage media such as floppy disks, hard disks, CD-ROMs, DVDs, read-only memory, and random access memory; as well as communications media such wires, optical fibers, microwaves, radio waves, and other electromagnetic or optical carriers.

Figure 3:
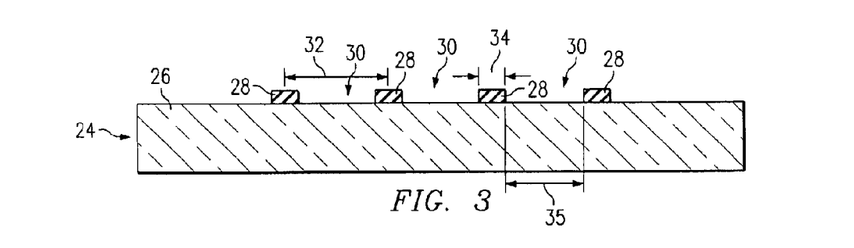
FIG. 3 illustrates a cross-sectional view of a reference target including features measured by a scanning electron microscope in accordance with teachings of the present invention.

FIG. 3 illustrates a cross-sectional view of reference target 24 that may be used to calibrate a SEM. Reference target 24 may include substrate 26 and features 28 and 30. Substrate 26 may be a transparent material, such as quartz, synthetic quartz, fused silica, magnesium fluoride ($MgF_2$), calcium fluoride ($CaF_2$), or a reflective material, such as silicon, that is used for either a photomask or a semiconductor wafer. Features 28 may be any shape, such as a polygon, a line, a circle, an oval, a rectangle, and a square, and features 30 may be any space between two or more polygons. Features 28 may be fabricated with any material used for patterned layer 18 described above in reference to photomask 12 or any material used to fabricate an integrated circuit, such as polysilicon, metal or silicon dioxide.

Features 28 and 30 may further be of suitable types and sizes that fall within a desired calibration range for a specific manufacturing process. In one embodiment, the desired calibration range may be approximately 50 nm to approximately 2 μm and reference target 24 may include approximately six to fifteen instances of features 28 and 30. The dimensions of features 28 and 30 may be established prior to the first time that reference target 24 is placed in a metrology system such that any measured dimensions may be compared to the predetermined values.

An initial calibration for a metrology system may include target values for feature pitch 32 and feature widths 34 and 35. Feature pitch 32 may represent the distance between one point on an instance of feature 28 and a corresponding point on another instance of feature 28. Feature width 34 may represent the width of feature 28 and feature width 35 may represent the width of feature 30. When reference mask 24 is used to evaluate the initial calibration of a metrology system, one or more of feature widths 34 and 35 may be measured to determine if the measurements produced by the metrology system are accurate.

In one embodiment, one of features 28 or 30 may be measured to determine if the calibration of the metrology system has shifted either up or down relative to the initial calibration. If only one feature is selected for a routine measurement to evaluate the initial calibration, a feature width near the center of a desired calibration range may be used. In another embodiment, two of features 28 or 30 may be measured to determine if the calibration of the metrology system has changed. Sampling of two features within a calibration range may allow for detection of two types of departures from the initial calibration: a shift up or down, similar to sampling a single feature relative to the initial calibration, and a tilting, or change in slope, of the calibration. If two features are selected, feature widths near each of the endpoints of the desired calibration range may be used. In a further embodiment, three or more of features 28 or 30 may be measured to re-calibrate the metrology system. In addition to the types of departures from the initial calibration that may be detected by measuring two features, the addition of the third feature may also detect any arching or bowing (e.g., changes in the curvature of a calibration curve) departures from the initial calibration. If three features are selected, feature widths near each endpoint and a feature width near the center of the desired calibration range may be used.

Figure 4:
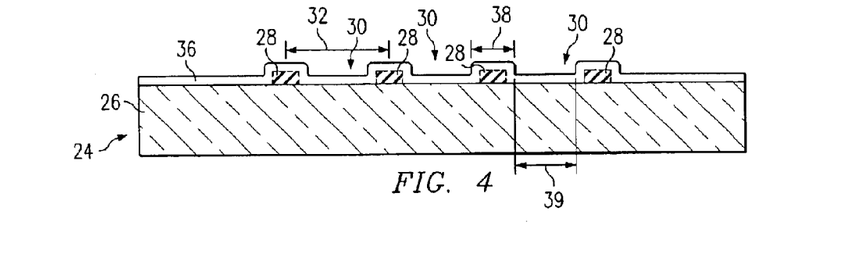
FIG. 4 illustrates a cross-sectional view of a reference target including features altered by carbon deposition produced in a scanning electron microscope in accordance with teachings of the present invention.

FIG. 4 illustrates a cross-sectional view of reference target 24 after being used to evaluate an initial calibration of a SEM multiple times. As described above, if a SEM is used to measure features on a photomask and/or semiconductor wafer carbon may be deposited at the interface of an electron beam in the SEM and a surface being imaged. Reference target 24 may be used to evaluate the initial calibration of the SEM and therefore, may be imaged multiple times. Over time, carbon layer 36 may be deposited on substrate 26 and features 28. As illustrated, feature pitch 32 may not be affected by the addition of carbon layer 36. However, the width of feature 28 (as illustrated by modified width 38) may increase in relation to feature width 34 and the width of feature 30 (as illustrated by modified width 39) may decrease in relation to feature width 35. If changes in the widths of features 28 and 30 are not taken into consideration when measuring features 28 and 30 after carbon layer 36 has formed on reference target 36, the calibration for the SEM may be improperly adjusted. Therefore, the rate of carbon deposition should be estimated in order to obtain the correct measurements for features 28 and 30.

Figure 5:
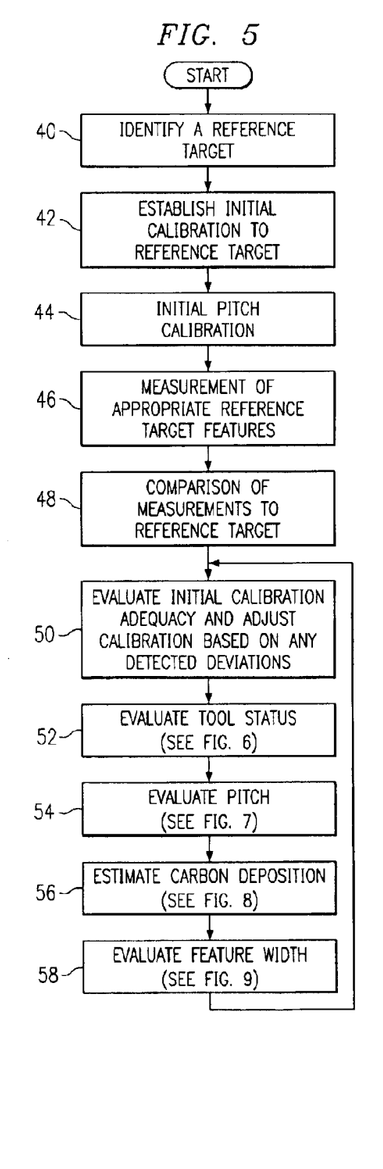
FIG. 5 illustrates a flow chart of a method for evaluating an initial calibration for a scanning electron microscope in accordance with teachings of the present invention.

FIG. 5 illustrates a flow chart of a method for evaluating an initial calibration for a SEM. Generally, a SEM may be calibrated before the SEM is used to measure features, such as critical dimensions, on a photomask or semiconductor wafer. In some cases, reference target 24 may include one or more of features 28 and 30 that have known dimensions within a desired calibration range and may be used to generate an initial calibration for the SEM. The initial calibration for the system may be evaluated on a regular basis to determine if the initial calibration is adequate. If any deviations from the initial calibration are detected, the calibration of the SEM may be adjusted to compensate for those deviations. During the calibration process, the SEM status, including the magnification factor and aspect ratio, may be evaluated for any changes over time, pitch 32 and feature widths 34 and 35 may be evaluated to determine if there are any deviations from the initial calibration and a rate of carbon deposition may be estimated to determine how feature widths 34 and 35 change. If any deviations are detected, the SEM may be adjusted so that current calibration matches the initial calibration. The SEM may then be used to measure CDs on photomasks and/or semiconductor wafers until the calibration is evaluated again.

At step 40, reference target 24 may be identified. Reference target 24 may include features 28 and 30 that are measurable in an optical system or a SEM. Features 28 and 30 may further have suitable types and sizes for the desired calibration range such that feature widths 34 and 35 used for calibration and control may have known sizes before reference target 24 is placed in the SEM.

At step 42, an initial calibration based on reference mask 24 may be established to allow the SEM to measure reference target 24 accurately. The initial calibration may include an initial pitch calibration at step 44. Pitch 32 may be measured across two of features 28, as illustrated in FIG. 3, or more than two of features 28 so that edges of the same type are included in the measurement. Pitch 32 may be used to establish a proper magnification factor because the amount of carbon deposition is approximately the same on the similar edges of features 28 that are involved in the pitch measurement. By establishing the correct magnification factor, the pitch measurement may remain relatively constant regardless of the amount of carbon deposited during a measurement process.

The initial calibration may also include the measurement of appropriate reference target features at step 46. In one embodiment, features 28 and 30 may be selected to have respective feature widths 34 and 35 within a desired calibration range for a specific manufacturing process. Generally eight to twelve different features may be measured across the desired calibration range. In one embodiment, the calibration range may be approximately 50 nm to approximately 2 μm. Features 28 and 30 may be isolated line structures, isolated shapes or a group of shapes, including, but not limited to, lines, rectangles, squares, triangles, polygons, ovals, and circles.

At step 48, the initial calibration may be created by measuring features 28 and 30 to obtain respective feature widths 34 and 35 that may be compared with the predetermined widths for features 28 and 30. If feature widths 34 and 35 match the respective predetermined widths, an additional calibration filter is not needed. However, if there is a difference, this difference may suggest an appropriate form for adjustments that may be made to the SEM. A filter based on the uncalibrated measurements for features 28 and 30 measured may be characterized as a calibration curve and may be generally expressed as:

Initial Calibration=*f*(Uncalibrated Measurement of feature widths 34 and 35)

where f( ) is of a specific mathematical form with parameters that may be estimated using the uncalibrated measurement data and the predetermined widths for features 28 and 30.

Figure 6:
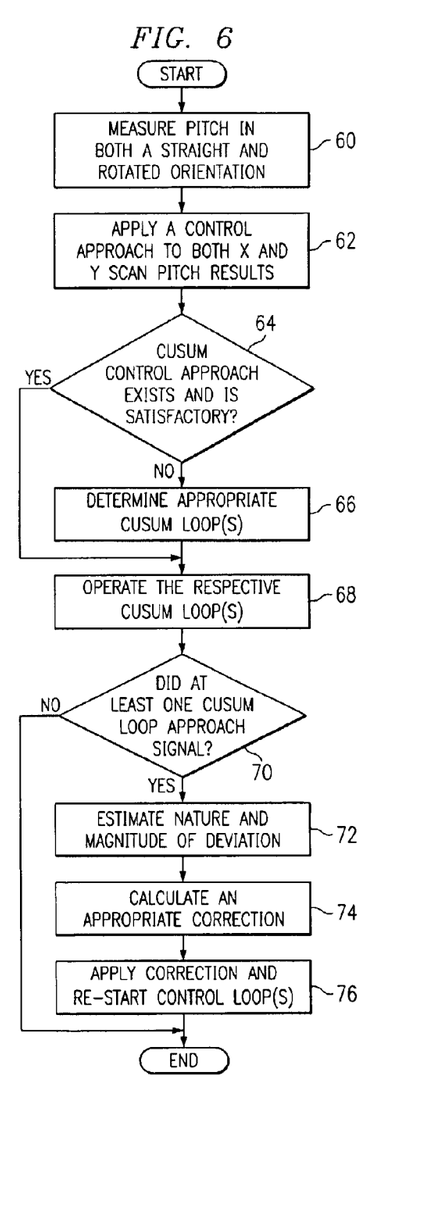
FIG. 6 illustrates a flow chart of a method for evaluating the status of a scanning electron microscope in accordance with teachings of the present invention.

At step 50, the initial calibration may be routinely evaluated for accuracy and adjusted as any deviations are detected. At step 52, the status of the SEM may be evaluated by checking a magnification factor and aspect ratio associated with the SEM. FIG. 6 further illustrates the process for comparing a target magnification factor and a target aspect ratio with a current magnification factor and aspect ratio to evaluate the SEM status. The pitch measurement of features 28 on reference target 24 may then be evaluated at step 54. Generally, the accuracy of SEM with respect to pitch measurement may be evaluated to determine if there has been any change in an initial pitch measurement. The specific steps associated with comparing a target pitch measurement with a current pitch measurement during the pitch evaluation process are further described in reference to FIG. 7. At step 56, a rate of carbon deposition may be estimated and evaluated for any changes in the rate. The rate of carbon deposition may be monitored and adjusted for changes as features 28 and 30 are repeatedly measured by the SEM. The specific steps associated with the carbon deposition estimation are further described in reference to FIG. 8. Once the carbon deposition rate is determined, feature widths 34 and 35 may be measured to determine if there is any deviation from the initial calibration at step 58. FIG. 9 further illustrates the steps associated with evaluating the accuracy of the measurements for features 28 and 30. Although FIG. 5 illustrates a particular order and number of parameters associated with a SEM that may be evaluated, some of the parameters may not need to be evaluated and the evaluations may be performed in a different order.

FIG. 6 illustrates a flow chart of a method for evaluating the status of a SEM. Generally, the status of the SEM may be determined by measuring parameters such as magnification factor and aspect ratio by using any type of reference target. A silicon wafer, however, may be more receptive to electron beam imaging and may be better suited for evaluating the electron beam in a SEM.

At step 60, feature pitch 32 may be measured in a straight and rotated orientation. Feature pitch 32 may represent one line-space pattern, a group of line-space patterns or any other suitable types of features or groups of features on reference target 24. Feature pitch 32 may be representative of the pitch sizes to be routinely measured with the SEM. In one embodiment, five to ten different locations on reference target 24 that have approximately the same nominal pitch size may provide an accurate number of measurements for a given rotation. The same features may be measured in a straight orientation (e.g., the X-scan direction) and a rotated orientation (e.g., the Y-scan direction).

Once the measurements for the straight and rotated orientations are determined, a control scheme may be applied in order to monitor ongoing tool aspect ratio and magnification factor applicability at step 62. In one embodiment, a Cumulative Summation (CUSUM) control scheme may be applied in order to provide an appropriate level of control for the pitch measurements generated in the X and Y scan directions. In other embodiments, any suitable process control approach may be applied that allows the initial calibration for the SEM to be evaluated for deviations and adjusted based on any detected deviations.

At step 64, a CUSUM control scheme may be evaluated to determine if it is satisfactory. If a CUSUM control scheme does not exist for the SEM or an existing CUSUM scheme is not adequate for the SEM, a new CUSUM loop may be determined at step 66. Example values and calculations associated with a CUSUM control scheme may be found in Table 1.

TABLE 1

Example Calculations for CUSUM Control Scheme

| Step | Sample Values or Formulas | Description |
|---|---|---|
| 1. Determine desired result for parameter | TARGET = desired result based on measurement from initial calibration | Generally a predetermined value that is dependent on the parameter being evaluated. |
| 2. Estimate inherent noise level | $S_d$ = inherent noise level | CUSUM control parameters are scaled by the inherent process noise level and, therefore, an estimate of the variation is used. An example estimate of variation may be obtained by using the Mean Squared Successive Difference (MSSD) estimator since MSSD uses differences between successive observations to estimate process variation. |
| 3. Determine tuning factors | $4 \leq H \leq 5$ and $0.5 \leq K \leq 1$ | K is related to the size of deviation that a CUSUM loop should detect and H is related to how quickly that the deviation is detected. |

TABLE 1-continued

Example Calculations for CUSUM Control Scheme

| Step | Sample Values or Formulas | Description |
|---|---|---|
| 4. Determine mode of operation | Standard = $S_{Hi}(0)$ = $S_{Lo}(0)$ = 0<br>Fast-Initial-Response (FIR) = $S_{Hi}(0)$ = $S_{Lo}(0) = H^*S_d/2$ | In the Standard mode of operation, the CUSUM loop will be initiated with the sums equal to zero. By starting the loop halfway to a signal (as shown for the FIR mode), process deviations may be detected more quickly. |
| 5. Operate CUSUM loop | High Side Sum<br>$S_{Hi}(t)$ = MAX [0, $(d_j(t) - TARGET) - K^*S_{dj} + S_{Hi}(t-1)$] = MAX [0, $d_j(t) - K^*S_{dj} + S_{Hi}(t-1)$]<br>Low Side Sum<br>$S_{Lo}(t)$ = MAX[0, $(TARGET - d_j(t)) - K^*S_{dj} + S_{Lo}(t-1)$] = MAX[0, $-d_j(t) - K^*S_{dj} + S_{Lo}(t-1)$]<br>where t = 1, 2, . . . indexes the sampling time/periods,<br>TARGET = desired result,<br>K = the chosen CUSUM tuning parameter,<br>$d_j(t)$ = Data value j at time t,<br>$S_{dj}$ = Estimate of Process Variation for Data value j,<br>$S_{Hi}(0) = S_{Hi}(0)$ = 0 for standard operation, or = $H^*S_{dj}/2$ for FIR operation, and<br>H = the chosen CUSUM tuning parameter.<br>Deadband<br>TARGET +/- $K^*S_{dj}$ | The CUSUM loop may signal an off-target condition in either a positive or negative direction such that data may be recorded for both high and low side deviations. In general, one of the high or low side sums may be "active". Neither sum will be "active" as long as the results fall within the deadband. As results fall outside of the deadband, the sum becomes "active" and any result will contribute to the sum. An off-target signal may be deemed to occur if a sum exceeds its signal limit of $H^*S_{dj}$. A running count of the number of sampling periods that a sum has been "active" in a standard CUSUM and a running record of a starting value for each sum in a FIR CUSUM may be documented to estimate the magnitude of the deviation at the time of a signal. |

In one embodiment, steps one through four in Table 1 may only be used for initial CUSUM control loop design and/or for periodic review of an existing CUSUM control loop. Once a CUSUM loop is established, the loop may be operated as shown in Table 1 at step 68.

At step 70, any established CUSUM loops may be sampled to determine if at least one of the loops has approached the signal. If none of the loops signals, the calibration for the SEM has not deviated from the initial calibration and no adjustments are made to the aspect ratio and magnification factor for the SEM. If at least one of the CUSUM loops signals, the nature and magnitude of the deviation from the initial aspect ratio and magnification factor may be estimated at step 72. A separate loop may be used to represent the pitch measurements in the X and Y scan directions and each loop may signal individually or simultaneously. When any CUSUM loop signals, a current sum ($S_{Hi}(t)$ and/or $S_{Lo}(t)$), counter ($N_{Hi}(t)$ and/or $N_{Lo}(t)$), and start value ($Start_{Hi}(t)$ and/or $Start_{Lo}(t)$) may be used to estimate the magnitude of the deviation for the given parameter as follows:

$$Deviation_j(t) = Dev_{Hij}(t) + Dev_{Loj}(t),$$

for j=1,2, or 3, as applicable, and where
If $S_{Hi}(t) > Start_{Hi}(t)$, then $$Dev_{Hij}(t) = K^*S_{dj} + [S_{Hi}(t) - Start_{Hi}(t)]/[N_{Hi}(t)+1]'$$

else $Dev_{Hij}(t) = 0$, and
If $S_{Lo}(t) > Start_{Lo}(t)$, then $$Dev_{Loj}(t) = K^*S_{dj} - [S_{Lo}(t) - Start_{Lo}(t)]/[N_{Lo}(t)+1]'$$

else $Dev_{Loj}(t) = 0$ $Deviation_j(t)$ may be obtained at any point in time but at the time of a signal (e.g., t=s), the following vector may represent the nature and magnitude of the deviation from the initial calibration in terms of the X and Y scan directions.

$$\underline{D}_s = \begin{bmatrix} Deviation_1(s) \\ Deviation_2(s) \end{bmatrix} = \begin{bmatrix} Dev_X(s) \\ Dev_Y(s) \end{bmatrix}.$$

A positive deviation may indicate that the SEM is providing a larger measurement for feature pitch 32 than initially in the specific orientation and a negative deviation may indicate a smaller measurement.

Once the deviation vector, $\underline{D}_S$, is determined, the vector may be used to estimate an appropriate correction to re-align the current SEM performance with the initial calibration at step 74. The deviation vector may be transformed into pitch factors as show by the following formula:

$$P_{F,D}(s) = Target\ Pitch/[Target\ Pitch + Dev_D(s)]'$$

for D=X and Y, giving $$\underline{P}_F = \begin{bmatrix} P_{F,X}(s) \\ P_{F,Y}(s) \end{bmatrix}$$

where $\underline{P}_F$ is a vector of X and Y pitch factors. These pitch factors may then be applied to adjust the aspect ratio and magnification factor for the SEM.

Aspect ratio may generally reflect the ratio of X scan results to Y scan results and a new aspect ratio may be obtained with the following formula:

$$AR_S = AR_C * P_{F,X}(S)/P_{F,Y}(S)$$

Generally, a change in aspect ratio may require a corresponding change in the magnification factor and a new magnification factor may be obtained with the formula below:

$$Mag_S = Mag_C / [P_{F,X}(s) + P_{F,Y}(s))/2]$$

Once the new aspect ratio and magnification factor are obtained, the values may be updated on the SEM according to the calculations and the respective CUSUM loops may be restarted at step 76.

Figure 7:
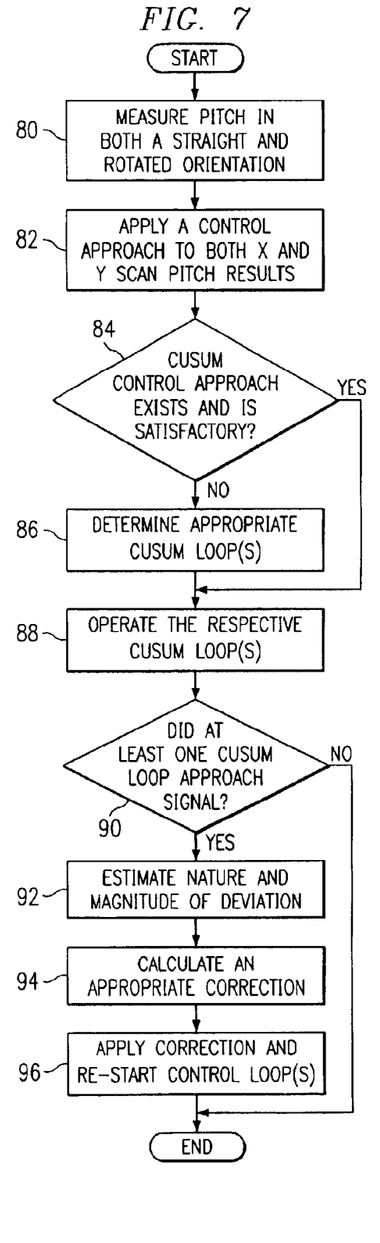
FIG. 7 illustrates a flow chart of a method for evaluating pitch measured by a scanning electron microscope in accordance with teachings of the present invention.

FIG. 7 illustrates a flow chart of a method for evaluating pitch measured by a SEM. Generally, the steps associated with evaluating pitch may be similar to the steps associated with evaluating tool status, as described above in reference to FIG. 5. In one embodiment, pitch may be evaluated by measuring a photomask reference target, rather than a silicon wafer, to fine-tune the pitch measurement for a type of surface that is more consistent with general SEM operation.

At step 80, feature pitch 32 may be measured in a straight and rotated orientation. Similar to the pitch measurement described in reference to FIG. 5, feature pitch 32 may represent one line-space pattern, a group of line-space patterns or any other suitable types of features on reference target 24. The actual pitch size may be representative of the feature sizes to be routinely measured with the SEM. In one embodiment, five to ten different locations of approximately the same nominal pitch size may provide an accurate number of measurements for a given rotation. The same features may be measured in a straight orientation (e.g., the X-scan direction) and a rotated orientation (e.g., the Y-scan direction).

Once the measurements for the X and Y-scan directions are determined, a control scheme may be applied in order to monitor ongoing aspect ratio and magnification factor applicability at step 82. As described above for the SEM status, a CUSUM control scheme may be applied in order to provide an appropriate level of control for the pitch measurements generated in the straight and rotated orientations. At step 84, a CUSUM control scheme may be evaluated to determine if one has been created for the pitch measurement and/or if the current control scheme is satisfactory. If a CUSUM control scheme does not exist for the SEM or an existing CUSUM scheme is not adequate for the SEM, a new CUSUM loop may be determined at step 86. An appropriate CUSUM loop may be generated by following the steps listed in Table 1.

In one embodiment, one pitch size may be evaluated and the desired result may be similar to the desired result for the tool status, as described in reference to FIG. 6. In another embodiment, more than one pitch size may be evaluated and the desired result may be one. The multiple pitch sizes may be managed by averaging the results across the multiple sizes or fitting an appropriate curve to each of the X and Y-scan pitch factors based on the target pitch size. All data may be transformed to pitch factors by dividing the results by the relevant target pitch size. If one pitch size is evaluated, two CUSUM loops may represent the X and Y-scan directions. If multiple pitch sizes are evaluated, the CUSUM loops described below in reference to feature width in FIG. 9 may be used. The remaining steps for creating the CUSUM loops may be similar to the steps described in Table 1. Once the CUSUM loops have been established, the loops may be operated as described in Table 1 at step 88.

At step 90, the CUSUM loops are sampled to determine if at least one of the loops has approached the signal. If none of the loops signals, the X-pitch and/or Y-pitch measurements have not deviated from their measurements in the initial calibration. If at least one of the CUSUM loops signals, the nature and magnitude of the deviation may be estimated at step 92. If only one pitch size is evaluated, the method for evaluating the deviation may be similar to that described with respect to tool status in FIG. 6. If more than one pitch size is evaluated, the method for evaluating the deviation may be similar to that described below in reference to FIG. 9.

Once any identified deviations are transformed to pitch factors (as described above in reference to FIG. 6), the appropriate correction may be applied to the respective pitch factor at step 94. If only one pitch size is evaluated, or multiple pitch sizes are combined and evaluated globally as an average, the adjustment may be multiplied by the current pitch factor to produce a new pitch factor to apply to future results. Calculation of the new pitch factor is described above in reference to SEM status in FIG. 6. If a curve fitting approach is used, the current pitch factors may be generated with the following calculation:

$$PF_D = \text{Target Size}/[\text{Target Size} + f_D(\text{Size})]$$

where D=X or Y. The new pitch factors may then be obtained by adding the function of pitch deviations determined in step 72 as described above in FIG. 6, to the current $f_D(\text{Size})$, generating a new $f'_D(\text{Size})$ and a new $PF'_D$ to apply to future results. Once the new pitch factors are obtained, the values may be updated on the SEM according to the calculations and the respective CUSUM loops may be restarted at step 96.

Figure 8:
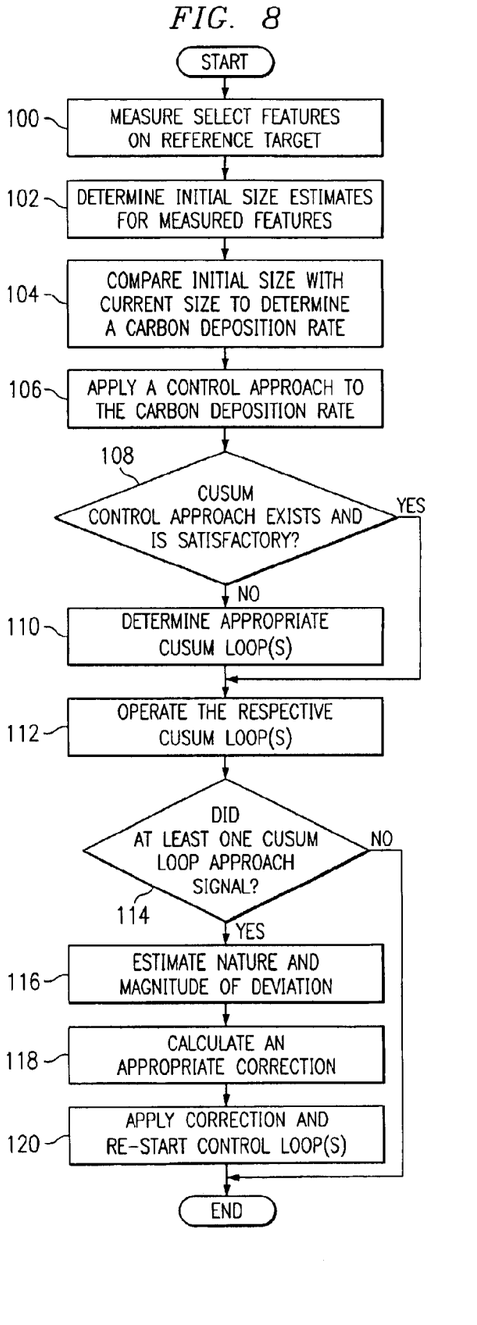
FIG. 8 illustrates a flow chart of a method for estimating a rate of carbon deposition by a scanning electron microscope in accordance with teachings of the present invention.
Figure 9:
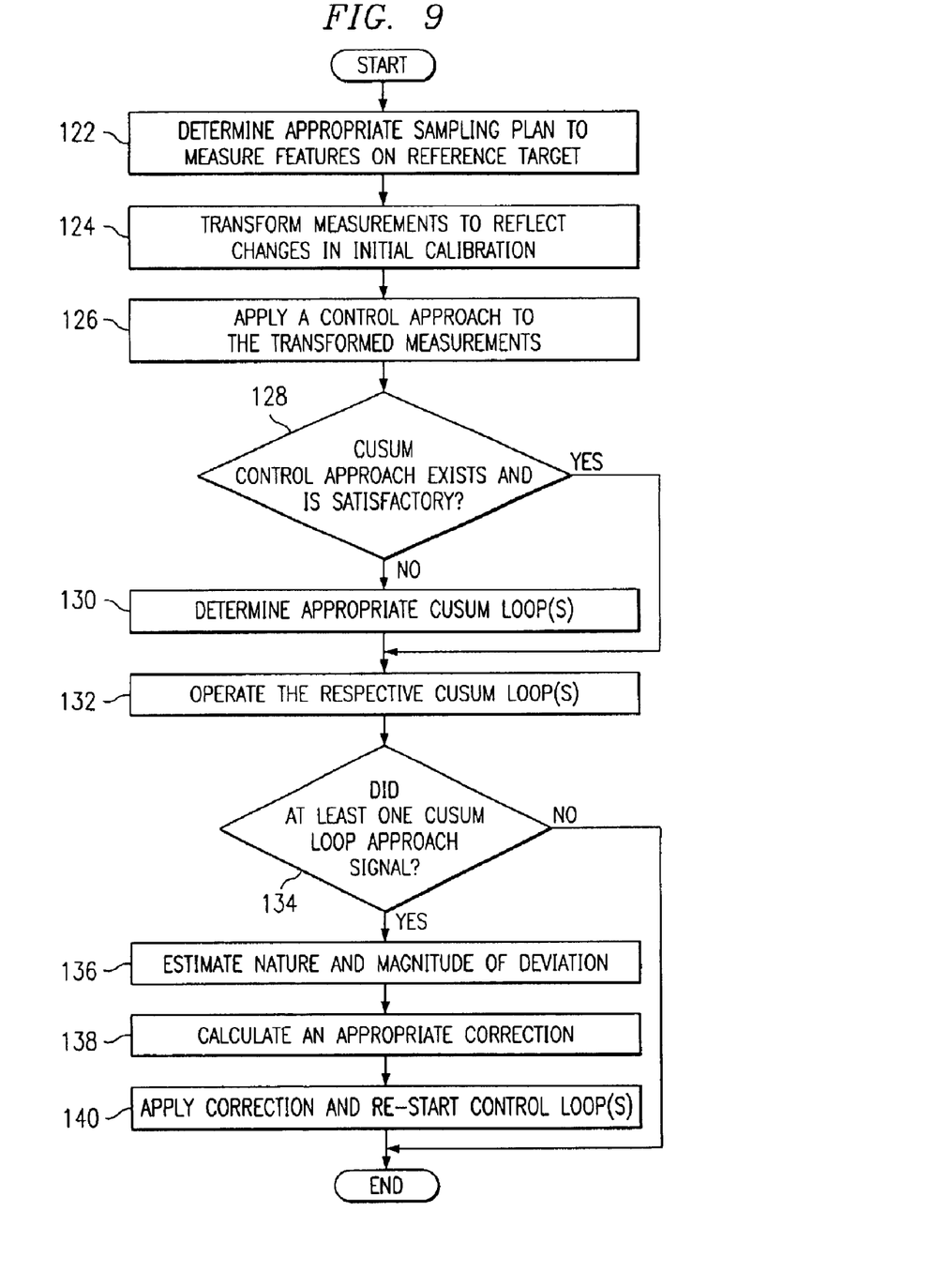
FIG. 9 illustrates a flow chart of a method for evaluating the accuracy of a feature width measurement provided by a scanning electron microscope in accordance with teachings of the present invention.

FIG. 8 illustrates a flow chart of a method for estimating a rate of carbon deposition on reference target 24 when placed in a SEM. A SEM may deposit a thin layer of carbon at the interface of a surface being imaged and a scanning electron beam in the SEM. The amount of carbon deposited during one scan may be negligible but if a surface is scanned multiple times (e.g., reference target 24 is used to evaluate the initial calibration of the SEM on a regular basis), the extra layer may affect the accuracy of the measurements provided by the SEM. While pitch measurements may not be affected by the layer since the SEM measures the distance between a point on one feature to the corresponding point on another feature, widths of individual features may be affected. Therefore, the rate of deposition and any changes in the rate should be taken into consideration when measuring feature width.

At step 100, the number of features 28 and 30 on reference target 24 that the SEM may measure may be selected. In one embodiment, between approximately five and ten different sites on reference target 24 may be selected to measure features 28 and 30. In one embodiment, the selected sites may be measured with the same magnification used to measure feature widths 34 and 35 (described in detail below with respect to FIG. 9) since the carbon deposition rate is related to magnification. In one embodiment, the sizes of features 28 and 30 may not need to be known since the results are evaluated for the rate of change, or the amount of carbon that is deposited, over time.

Once the various features and sites have been selected, initial sizes for the features may be determined at step 102. The initial sizes may provide a starting point from which to begin estimating the carbon deposition rate and may be set by using the initial SEM measurements of features 28 and 30 included in the initial calibration for the SEM or by using an average of a limited number of the measurements. In one embodiment, starting points for the features in the X and Y scan directions may be used since evaluation of feature widths 34 and 35 may require the features to be measured in both directions.

At step 104, the initial sizes for features 28 and 30 may be compared with a current size as measured by the SEM in order to determine an initial estimate of the rate of carbon deposition. The measurements provided by the SEM may include any relevant pitch or line width adjustments in order to prevent a control scheme from indicating a change in carbon deposition rate that is attributable to a drift in either pitch or feature width calibration. The first time that a feature is measured, the result may be identified as:

$$M_t = \text{Average Result at Time } T - \text{Initial Size}$$

where $M_t$ is the magnitude of the difference between the initial measured feature size and the current measured feature size. In one embodiment, the magnitude may be approximately equal to the expected initial carbon deposition rate. For each subsequent measurement of a given feature, an estimator of linear trend may be obtained by subtracting the previous magnitude from the current magnitude and using a recursive formula as shown below:

$$\delta_{t+1} = \delta_t*(t-1)/(t+2) + 6*(M_{t+1} \text{Avg}(M_t))/[(t+1)*(t+2)]$$

where $\delta$ is the estimator of linear tread, $\delta 1 = 0$ and $\text{Avg}(Mt) = (1/t * \Sigma_{i=1}^{t} M_i)$.

Once the carbon deposition rate is determined, a control scheme may be applied in order to determine if the carbon deposition rate has changed at step 106. As described above for the SEM status and pitch evaluations, a CUSUM control scheme may be applied in order to provide an appropriate level of control for the carbon deposition rate. At step 108, a CUSUM control scheme may be evaluated to determine if one has been created for the carbon deposition rate and/or if the current control scheme is satisfactory. An appropriate CUSUM loop may be generated according to the steps described in Table 1. The target or desired result may be an initial rate of carbon deposition. In one embodiment, a SEM manufacturer may provide a initial estimate of the carbon deposition rate or a set of preliminary repeated measurements on similar features may be used. In another embodiment, historical data from a similar system may be available. Once the target is determined, the inherent noise level for the process may be estimated. In one embodiment, the estimate may be similar to that described in Table 1. However, the variation of the estimated linear coefficients may be dependent on how many sampling opportunities are involved in the estimate. The CUSUM data, therefore, may be adjusted as follows:

$$CR_t = (\delta_t - \delta_{Target}) * [t(t+1)/12]^{0.5}$$

where $CR_t$ is the CUSUM Rate at Time t. Once the inherent noise level is established, the appropriate tuning factors for the CUSUM loop may be determined. Again, this determination is similar to what is described in Table 1. Finally, the mode of CUSUM loop operation may be determined. In one embodiment, the CUSUM loop may be a Fast-Initial-Response (FIR) CUSUM that is initiated half way to a signal since it may be desirable to detect and correct any change in the rate of carbon deposition before the change impacts the feature width control.

If the CUSUM control scheme is determined to be satisfactory or has been initiated for the first time, the CUSUM loops associated with each measured feature on reference target 24 may be operated at step 112. The operation of the CUSUM loops for the carbon deposition rate may be similar to the operation described above in Table 1 with the following relationship applied:

$$d_j(t) - \text{TARGET} = CR_t = (\delta_t \delta_{Target}) * [t*(t+1)12]^{0.5}$$

At step 114, the CUSUM loops are sampled to determine if at least one of the loops has approached the signal. If none of the loops signals, the carbon deposition rate has not changed since the last time that the SEM was calibrated. If at least one of the CUSUM loops signals, the nature and magnitude of the deviation may be estimated at step 116. In one embodiment, a CUSUM loop may correspond to each feature that is measured and the loops may be managed independently of each other. By using the estimate of the linear trend available at the time of a signal, the high and low side calculations (as described in Table 1) may be as follows:

High: $\delta_{New} \delta_{Current} + (\delta_t - \delta_{Current}) * N_{Hi}(t)/N_{Hi}(t) + 1)$ Low: $\delta_{New} = \delta_{Current} - (\delta_{Current} - \delta_t) * N_{Lo}(t)/(N_{Lo}(t)+1)$ where $N_{Hi}(t)$ and $N_{Lo}(t)$ are the respective CUSUM loop counters as described above in reference to FIG. 6.

Once a new carbon deposition rate is determined, an appropriate correction may be calculated at step 118. If the new deposition rate suggests that features 28 are shrinking and features 30 are growing, the change may be related to factors other than a change in the carbon deposition rate. Also, if the estimates of deposition rates are greater than approximately 0.5 nm per measurement, the change may be related to other dynamics in the measurement process. For features 28 the new deposition rate estimate at a signal may be given by:

$$\delta^*_{New} = \begin{cases} 0 & \text{if } \delta_{New} \leq 0 \\ \delta_{New} & \text{if } 0 < \delta_{New} \leq 0.5 \\ 0.5 & \text{if } \delta_{New} \geq 0.5 \end{cases}$$

The new deposition rate estimate at a signal for features 30 may be given by:

$$\delta^*_{New} = \begin{cases} -0.5 & \text{if } \delta_{New} \leq -0.5 \\ \delta_{New} & \text{if } -0.5 < \delta_{New} < 0 \\ 0 & \text{if } \delta_{New} \geq 0 \end{cases}$$

Once the new carbon deposition rate is obtained, the value may be updated on the SEM according to the calculations and the respective CUSUM loops may be restarted at step 120.

FIG. 9 illustrates a flow chart of a method for evaluating the accuracy of feature widths 34 and 35 measured by an SEM. In order to ensure that the SEM is accurately measuring any critical dimensions on photomask 12, the initial calibration of the SEM with respect to features widths 34 and 35 may be evaluated. Since a proper evaluation may depend on the rate that carbon is deposited on the surface of a target being imaged, the evaluation process for the rate of carbon deposition may be performed before the evaluation of the accuracy of the feature width control.

At step 122, an appropriate sampling plan to measure features 28 and 30 on reference target 24 may be determined. As described above, an initial calibration may consist of measuring eight to twelve different feature sizes. Since measuring all of the features would be equivalent to a full re-calibration of the SEM, a subset of the group may be appropriate for re-calibrating a metrology system on a regular basis. As described above in reference to FIG. 3, a sample size of one feature may detect a shift of the current calibration relative to the initial calibration, a sample size of two features may detect a shift and a tilt (e.g., a change in slope for the calibration curve) of the current calibration relative to the initial calibration, and a sample size of three features may detect a shift, a tilt and a bowing or arching (e.g., a change in the curvature of the calibration curve) of the current calibration relative to the initial calibration. In one embodiment, three features may be an appropriate sample since adding more features may require more time for control purposes. In addition to choosing the number of features to be measured, a frequency of when to re-calibrated the SEM may also be selected. In one embodiment, a sampling frequency between approximately once a day to approximately once a week may be appropriate.

Once the features have been selected and measured during a re-calibration process, the measurements provided by the SEM may be transformed to reflect changes in the initial calibration at step 124. First, the initial or target feature widths measured during the calculation of the initial calibration may be subtracted from the measured feature widths. For example, $\underline{x}$ may define a vector of measurements taken at time 0 for a given calibration process and $\underline{\mu}$ may define a vector of the respective target widths for the measured features. The conversion to error to target data may be defined as:

$$\underline{\Delta}_0 = \underline{x}_0 - \underline{\mu}$$

Since the measurements provided by the SEM are a function of the rate of carbon deposition, the vector of target widths for the measured features may be defined as:

$$\underline{\mu} = \underline{\mu}_t = \underline{\mu}_{t-1} + \underline{\delta}_t$$

where $\underline{\delta}_t$ is a vector of the carbon deposition rate estimates at time t for the respective features.

Next, the error to target data may be converted via transformation matrices into an estimate of the calibration performance for the SEM. For a sample size of one, two or three features, the following matrices may allow for the evaluation of specific types of changes to the calibration of the SEM:

$$T_1 = 1$$

$$T_2 = \begin{bmatrix} 1 & 1 \\ -1 & 1 \end{bmatrix}$$

$$T_3 = \begin{bmatrix} 1 & 1 & 1 \\ -1 & 0 & 1 \\ 1 & -2 & 1 \end{bmatrix}$$

By multiplying the transformation matrix and the error to target vector, a vector of calibration departure estimates $\underline{d}_0$ may be produced as follows:

$$\underline{d}_0 = T_M \underline{\Delta}_0, \text{ for } n=1,2,3$$

The elements of the deviation vector, do, may estimate specific types of deviations from the initial calibration curve, and may be labeled as indicated below:

$$\underline{d}_0 = T_1 \underline{\Delta}_0 = SHIFT_0 = \Delta_1$$

$$\underline{d}_0 = T_2 \underline{\Delta}_0 = \begin{bmatrix} SHIFT_0 \\ SLOPE_0 \end{bmatrix} = \begin{bmatrix} \Delta_1 + \Delta_2 \\ \Delta_2 - \Delta_1 \end{bmatrix}$$

$$\underline{d}_0 = T_3 \underline{\Delta}_0 = \begin{bmatrix} SHIFT_0 \\ SLOPE_0 \\ CURVE_0 \end{bmatrix} = \begin{bmatrix} \Delta_1 + \Delta_2 + \Delta_3 \\ \Delta_3 - \Delta_1 \\ \Delta_1 - 2\Delta_2 + \Delta_3 \end{bmatrix}$$

SHIFT may be defined as the sum of the deviations from the target widths for the features measured to evaluate the given calibration. As the current calibration shifts up from the initial calibration, the measured widths may be larger than the target widths and SHIFT may increase in magnitude. Similarly, as the current calibration shifts down from the initial calibration, the measured widths may be smaller than the target widths and SHIFT may decrease in magnitude. Furthermore, if the current calibration shifts up or down, then other deviation parameters (e.g., SLOPE and CURVE as applicable) may remain near zero.

SLOPE may be defined as the difference in the errors to target at the extremes of the calibration range. As the current calibration becomes steeper than the initial calibration, the errors at the high end of the range may be greater than the target widths and the errors at the low end of the range may be smaller than the target widths. The opposite may be true if the current calibration becomes flatter than the initial calibration, e.g., the errors at the high end of the range may be smaller than the target widths and the errors at the low end of the range may be greater than the target widths. Again, due to the independence among the deviation parameters, SLOPE may change while SHIFT and CURVE remain near zero.

CURVE may be defined as the relationship between the two ends and the middle portion of the calibration range. As the current calibration bows in relation to the initial calibration, the measurements in the middle of the calibration range may be smaller than the target widths and the measurements at the ends may be greater than the target widths. If the current calibration arches in relation to the initial calibration, the measurements in the middle of the calibration range may be greater than the target widths and the measurements at the ends may be smaller than the target widths. As the CURVE relationship changes, SHIFT and SLOPE may remain near zero.

Once the measured values for feature widths 34 and 35 have been converted into a deviation vector, a control scheme may be applied to each element of the deviation vector in order to evaluate calibration stability of the SEM at step 126. As described above in Table 1, a CUSUM control scheme may be applied to parameters associated with the SEM. At step 128, a CUSUM control scheme may be evaluated to determine if one has been created for the SEM and/or if the current control scheme is satisfactory.

If a CUSUM control scheme does not exist for the feature width measurements provided by the SEM or an existing CUSUM scheme is not adequate, a new CUSUM loop may be determined at step 130. As described in step one of Table 1, an appropriate CUSUM loop may be generated by determining the desired result for the loop. If the measurements obtained for a given evaluation of a specific calibration are approximately equal to the target values in the initial calibration, the deviation vector may be all zeros. The target or desired result, therefore, may be approximately equal to zero. The second step for establishing a CUSUM loop (as described in Table 1) is to estimate the inherent noise level for the process. The calculation shown in Table 1 may be adjusted as follows:

$S_{SHIFT}=S*\text{Sqrt}(n)$, where n=the number of features to be measured $S_{SLOPE}=S*\text{Sqrt}(2)$ $S_{CURVE}=S*\text{Sqrt}(6)$ since the variation estimate should be appropriate for the SHIFT, SLOPE and CURVE parameters. The remaining two steps for creating an appropriate CUSUM loop may be similar to steps three and four described above in Table 1. Once the CUSUM loops have been established, the loops may be operated as shown in Table 1 at step 132. At step 134, the CUSUM loops are sampled to determine if at least one of the loops has approached the signal. If none of the loops signals, the calibration of SEM has not deviated from the initial calibration. If at least one of the CUSUM loops signals, the calibration of the SEM may have drifted from the initial calibration and the nature and magnitude of the deviation may be estimated at step 136. As described above, one loop may be provided for each estimated deviation statistic. Therefore, if three features on reference target 24 are measured, a separate CUSUM loop may be operating for SHIFT, SLOPE and CURVE. When a signal occurs on any one of the three loops, a simultaneous signal may occur on the other loops.

Since a simultaneous signal may occur, the CUSUM loops associated with the same calibration may be managed together and the information carried by all associated loops may be utilized to estimate a deviation.

When at least one loop signals, the relevant deviation may be calculated in a manner similar to calculating a deviation from a carbon deposition rate as described above in reference to FIG. 8. At the time of a signal, the following vector may represent the nature and magnitude of the deviation from the initial calibration:

$$D_8 = \begin{bmatrix} Deviation_1(s) \\ Deviation_2(s) \\ Deviation_3(s) \end{bmatrix} = \begin{bmatrix} Dev_{shift}(s) \\ Dev_{slope}(s) \\ Dev_{curve}(s) \end{bmatrix}$$

The size of the vector may be equal to the number of features 28 and 30 that are measured on reference target 24 during a re-calibration process. The vector further describes the nature of the deviation from the initial calibration in terms of SHIFT, SLOPE and CURVE, and the magnitude of the deviation may be described by the actual values of the vector.

Once the nature and magnitude of the deviation of a current calibration from the initial calibration is determined, an appropriate correction in order to re-align the current calibration for the SEM to the initial calibration may be calculated at step 138. First, the deviation vector may be transformed back into the measurement space by multiplying the vector by the inverse of the transformation matrices described above. The inverse matrices may be as follows:

$$T_1^{-1} = 1$$

$$T_2^{-1} = \left(\frac{1}{2}\right) * \begin{bmatrix} 1 & -1 \\ 1 & 1 \end{bmatrix}$$

$$T_3^{-1} = \left(\frac{1}{6}\right) * \begin{bmatrix} 2 & -3 & 1 \\ 2 & 0 & -2 \\ 2 & 3 & 1 \end{bmatrix}$$

By multiplying the relevant inverse matrix times the deviation vector, a vector of suggested calibration adjustments at the sampled feature sizes may be produced, as shown by the following formula:

$$a_s = T^{-1} D_s$$

Next, an appropriate curve may be fit to indicate the adjustments at the sampled feature sizes. Since the re-calibration process may use a subset of the features used to generate the initial calibration the adjustment vector, $a_s$, may be used to estimate appropriate adjustments for all the feature sizes used to build the initial calibration. In one embodiment, the estimate may be provided by fitting a curve that passes through the points defined by the adjustment vector and the associated feature size targets. The curve may be identified by finding the vector, $\beta$, that solves the following calculation:

$$M_s \beta = a_s$$

where $M_s$ is dependent on the feature sample size as follows:

for n=1, $M_S$=1 for n=2, $M_S$=[$\underline{1}$ $\underline{\mu}$]

for n=2, $M_S$=[$\underline{1}$ $\underline{\mu}$ $\underline{\mu}^2$]

where $\underline{1}$ is a vector with all elements equal to one, p is a vector of the sampled feature size targets and $\underline{\mu}^2$ is a vector of the sampled features size targets squared. The vector $\underline{\beta}$ may define the parameters of a polynomial curve fit to the adjustment values. For a sample size of n=1, the result may be DevSHIFT=SHIFT. For a sample size of n=2, the curve may be a line and for n=3, the curve may be a parabola. The vector $\underline{\beta}$ may be obtained as follows:

$$\underline{\beta} = M_s^{-1} \underline{a}_s, \text{ where}$$

for $n = 1$, $M_s^{-1} = 1$ for $n = 2$, $M_x^{-1} = \left[\frac{1}{(\mu_2 - \mu_1)}\right] * \begin{bmatrix} \mu_2 & -\mu_1 \\ -1 & 1 \end{bmatrix}$ for $n = 3$, $M_s^{-1} = \begin{bmatrix} \frac{\mu_2 \mu_3}{p} & \frac{-\mu_1 \mu_3}{q} & \frac{\mu_1 \mu_2}{r} \\ \frac{-(\mu_2 + \mu_3)}{p} & \frac{(\mu_1 + \mu_3)}{q} & \frac{-(\mu_1 + \mu_2)}{r} \\ \frac{1}{p} & \frac{-1}{q} & \frac{1}{r} \end{bmatrix}$ where $p = (\mu_2 - \mu_1)*(\mu_3 - \mu_1)$
$q = (\mu_2 - \mu_1)*(\mu_3 - \mu_2)$
$r = (\mu_3 - \mu_1)*(\mu_3 - \mu_2)$ Once the fitted curve parameters are obtained, the parameters may be used to estimate adjustments for the calibration relationship as follows:

$$\underline{A}_s = C\underline{\mu}$$

where the matrix C may be defined as:

for n=1, c=$\underline{1}$ for n=2, c=[$\underline{1}$ $\underline{c}$]

for n=3, c=[1 $\underline{c}$ $\underline{c}^2$]

with $\underline{1}$ being a vector with all elements equal to one, $\underline{c}$ being a vector of the established feature sizes at all of the calibration sizes across the calibration range that were used to determine the initial calibration and $\underline{c}^2$ being a vector of the elements in $\underline{c}$ squared.

Once the adjustment vector for the calibration is obtained, the correction may be applied and the respective CUSUM loops may be restarted at step 138. In one embodiment, the values from the adjustment vector may be added to the measured feature widths (e.g., the uncalibrated measurements) for the current calibration. The new calibration may have the same form as the initial calibration:

New Calibration=$f$(Uncalibrated Measurements for features 34 and 35+Adjustment$_s$)

For successive adjustments over time, the calibration may take the following form:

New Calibration =
$$f\left(\text{Uncalibrated Measurements for features 34 and 35} + \sum_s Adjustment_s\right)$$

where the summation may include all adjustments since the initial calibration of the SEM.

Although the present invention has been described in detail, it should be understood that various changes, substitutions, and alterations can be made without departing from the spirit and scope of the invention as defined by the appended claims.

What is claimed is:

1. A method for evaluating an initial calibration for a scanning electron microscope (SEM), comprising:
   generating an initial calibration for a SEM, the initial calibration including a target width for a feature on a reference target;
   measuring the feature on the reference target in the SEM to determine a measured width for the feature;
   estimating a rate of carbon deposition on the reference target during the measuring step;
   adjusting the target width of the feature based on the estimated rate of carbon deposition;
   comparing the measured width with the adjusted target width to generate a shift deviation; and
   adjusting a current calibration for the SEM based on the shift deviation.

2. The method of claim 1, wherein the reference target comprises a photomask.

3. The method of claim 1, wherein the reference target comprises a silicon wafer.

4. The method of claim 1, wherein comparing the measured width to the target width comprises subtracting the target width from the measured width to generate the shift deviation.

5. The method of claim 1, further comprising:
   the initial calibration including a target slope associated with the difference between a first target width for a first feature on the reference mask and a second target width for a second feature on the reference mask;
   measuring the first and second features on the reference mask to determine a first measured width and a second measured width, the difference between the first and second measured widths representing a measured slope;
   comparing the measured slope with the target slope to determine a slope deviation; and
   adjusting the current calibration based on the slope deviation.

6. The method of claim 1, further comprising:
   the initial calibration including a target curve associated with a plurality of target widths for a plurality of features on the reference mask;
   measuring the features on the reference mask to determine a plurality of measured widths, the measured widths representing a measured curve;
   comparing the measured curve with the target curve to determine a curve deviation; and
   adjusting the current calibration based on the curve deviation.

7. The method of claim 1, wherein the feature comprises a polygon.

8. The method of claim 1, wherein the feature comprises a space between at least two polygons.

9. The method of claim 1, wherein generating the initial calibration for the SEM comprises measuring a plurality of target features to determine a plurality of target widths and a plurality of target pitches.

10. The method of claim 1, further comprising:
    the initial calibration including a target pitch, the target pitch generated by measuring a distance between a location on a first feature and a corresponding location on a second feature;
    measuring the distance between the first and second features on the reference mask to determine a measured pitch;
    comparing the measured pitch with the target pitch to determine a magnification deviation; and
    adjusting the current calibration based on the magnification deviation.

11. The method of claim 10, further comprising:
    the initial calibration including a target aspect ratio for the SEM;
    measuring at least one of the first and second features in a straight orientation and a rotated orientation to respectively determine an X scan result and a Y scan result;
    determining a ratio between the X scan result and the Y scan result to generate a measured aspect ratio;
    comparing the measured aspect ratio with the target aspect ratio to determine a aspect ratio deviation; and
    adjusting the current calibration based on the aspect ratio deviation.

12. The method of claim 1, wherein adjusting the current calibration comprises adding the shift deviation to the current calibration such that the current calibration is approximately equal to the initial calibration.

13. A system for measuring feature widths on a target, comprising:
    a computer readable memory; and
    processing instructions encoded in the computer readable memory, the processing instructions, when executed by the processing resource, operable to perform operations comprising:
    generating an initial calibration for a SEM, the initial calibration including a target width for a feature on a reference target;
    measuring the feature on the reference target in the SEM to determine a measured width for the feature;
    estimating a rate of carbon deposition on the reference target during the measuring step;
    adjusting the target width of the feature based on the estimated rate of carbon deposition;
    comparing the measured width with the adjusted target width to generate a shift deviation; and
    adjusting a current calibration for the SEM based on the shift deviation.

14. The system of claim 13, further comprising the instructions operable to perform operations including:
    measuring a first feature and a second feature on the reference mask to respectively determine a first measured width and a second measured width, the difference between the first and second measured widths representing a measured slope;
    comparing the measured slope with a target slope to determine a slope deviation, the target slope included in the initial calibration; and
    adjusting the current calibration based on the slope deviation.

15. The system of claim 13, further comprising the instructions operable to perform operations including:
    the initial calibration including a target curve generated by measuring a plurality of target widths for a plurality of features on the reference mask;
    measuring a plurality of features on the reference mask to determine a plurality of measured widths, the measured widths representing a measured curve;
    comparing the measured curve with a target curve to determine a curve deviation, the target curve included in the initial calibration; and adjusting the current calibration based on the curve deviation.

16. The system of claim 13, further comprising the instructions operable to perform operations including:
measuring a distance between a location on a first feature and a corresponding location on a second feature on the reference mask to determine a measured pitch;
comparing the measured pitch with a target pitch to determine a magnification deviation, the target pitch included in the initial calibration; and
adjusting the current calibration based on the magnification deviation.

17. The system of claim 16, further comprising the instructions operable to perform operations including:
measuring at least one of the first and second features in a straight orientation and a rotated orientation to respectively determine an X scan result and a Y scan result;
determining a ratio between the X scan result and the Y scan result to generate a measured aspect ratio;
comparing the measured aspect ratio with a target aspect ratio to determine a aspect ratio deviation, the target aspect ratio included in the initial calibration; and
adjusting the current calibration based on the aspect ratio deviation.

18. Software for evaluating an initial calibration for a scanning electron microscope (SEM), the software being embodied in computer-readable media and when executed operable to:
generate an initial calibration for a SEM, the initial calibration including a target width for a feature on a reference target;
measure the feature on the reference target in the SEM to determine a measured width for the feature;
estimate a rate of carbon deposition on the reference target during the measuring step;
adjust the target width of the feature based on the estimated rate of carbon deposition;
compare the measured width with the adjusted target width to generate a shift deviation; and
adjust a current calibration for the SEM based on the shift deviation.

19. The software of claim 18 wherein comparing the measured width to the target width comprises subtracting the target width from the measured width to generate the shift deviation.

20. The software of claim 18, further operable to:
measure a first feature and a second feature on the reference mask to respectively determine a first measured width and a second measured width, the difference between the first and second measured widths representing a measured slope;
compare the measured slope with a target slope to determine a slope deviation, the target slope included in the initial calibration; and
adjust the current calibration based on the slope deviation.

21. The software of claim 18, further operable to:
measure a plurality of features on the reference mask to determine a plurality of measured widths, the measured widths representing a measured curve;
comparing the measured curve with a target curve to determine a curve deviation, the target curve included in the initial calibration; and
adjust the current calibration based on the curve deviation.

22. The software of claim 18, wherein adjusting the current calibration comprises adding the shift deviation to the current calibration such that the current calibration is approximately equal to the initial calibration.

23. A photomask, comprising:
a substrate; and
a patterned layer formed on at least a portion of the substrate, dimensions of features on the patterned layer measured with a scanning electron microscope (SEM), an initial calibration associated with the SEM evaluated by;
generating an initial calibration for the SEM, the initial calibration including a target width for a feature on a reference target;
measuring the feature on the reference target in the SEM to determine a measured width for the feature;
estimating a rate of carbon deposition on the reference target during the measuring step;
adjusting the target width of the feature based on the estimated rate of carbon deposition;
comparing the measured width with the adjusted target width to generate a shift deviation; and
adjusting a current calibration for the SEM based on the shift deviation.

24. The photomask of claim 23, further comprising the initial calibration evaluated by:
measuring a first feature and a second feature on the reference mask to respectively determine a first measured width and a second measured width, the difference between the first and second measured widths representing a measured slope;
comparing the measured slope with a target slope to determine a slope deviation, the target slope included in the initial calibration; and
adjusting the current calibration based on the slope deviation.

25. The photomask of claim 23, further comprising the initial calibration evaluated by:
measuring a plurality of features on the reference mask to determine a plurality of measured widths, the measured widths representing a measured curve;
comparing the measured curve with a target curve to determine a curve deviation, the target curve included in the initial calibration; and
adjusting the current calibration based on the curve deviation.

26. The photomask of claim 23, wherein the feature comprises a polygon.

27. The photomask of claim 23, wherein the feature comprises a space between at least two polygons.

28. The photomask of claim 23, further comprising the initial calibration evaluated by:
measuring a first feature on the reference mask to determine a measured width;
measuring a distance between a location on the first feature and a corresponding location on a second feature on the reference mask to determine a measured pitch;
comparing the measured pitch with a target pitch to determine a magnification deviation and the measured width with a target width to determine an aspect ratio deviation, the target pitch and the target width included in the initial calibration; and
adjusting the current calibration based on the magnification deviation and the aspect ratio deviation.

29. The photomask of claim 23, further comprising the initial calibration evaluated by:
measuring a distance between a location on a first feature and a corresponding location on a second feature on the reference mask to determine a measured pitch;

comparing the measured pitch with a target pitch to determine a magnification deviation, the target pitch included in the initial calibration; and adjusting the current calibration based on the magnification deviation.

30. The photomask of claim 29, further comprising the initial calibration evaluated by:

measuring at least one of the first and second features in a straight orientation and a rotated orientation to respectively determine an X scan result and a Y scan result;

determining a ratio between the X scan result and the Y scan result to generate a measured aspect ratio;

comparing the measured aspect ratio with a target aspect ratio to determine a aspect ratio deviation, the target aspect ratio included in the initial calibration; and adjusting the current calibration based on the aspect ratio deviation.

* * * * *